United States Patent
Kwak et al.

(10) Patent No.: US 7,430,099 B2
(45) Date of Patent: Sep. 30, 2008

(54) ELECTROSTATIC DISCHARGE PROTECTION CIRCUIT PROTECTING THIN GATE INSULATION LAYERS IN A SEMICONDUCTOR DEVICE

(75) Inventors: Kook Whee Kwak, Kyoungki-do (KR); Nak Heon Choi, Seongnam-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/648,328

(22) Filed: Dec. 29, 2006

(65) Prior Publication Data
US 2007/0195472 A1   Aug. 23, 2007

(30) Foreign Application Priority Data
Dec. 30, 2005   (KR) .................. 10-2005-0134953

(51) Int. Cl.
*H02H 9/00* (2006.01)
(52) U.S. Cl. ................................................. 361/56
(58) Field of Classification Search ............ 361/56
See application file for complete search history.

(56) References Cited

U.S. PATENT DOCUMENTS 5,917,689 A * 6/1999 English et al. ............. 361/56
6,388,850 B1 * 5/2002 Ker et al. .................. 361/56

FOREIGN PATENT DOCUMENTS

KR   1019980078109   11/1998

* cited by examiner

*Primary Examiner*—Michael J Sherry
*Assistant Examiner*—Christopher J Clark
(74) *Attorney, Agent, or Firm*—Ladas & Parry LLP

(57) ABSTRACT

An electrostatic discharge protection circuit protects the internal circuits of a semiconductor. The electrostatic discharge protection circuit includes a first electrostatic protection unit connected to a power source supply pad. The first electrostatic protection unit discharges an ESD current into the power source supply pad when an ESD is introduced into the input/output pad, and generates a first driving voltage by utilizing the ESD current flow through a voltage-drop unit. A driver driven by the first driving voltage generates a second driving voltage by an ESD current. A second electrostatic protection unit discharges the introduced ESD current into the power source supply pad by the second driving voltage such that a voltage applied to a gate of the first NMOS transistor is reduced.

12 Claims, 4 Drawing Sheets

US 7,430,099 B2

ELECTROSTATIC DISCHARGE PROTECTION CIRCUIT PROTECTING THIN GATE INSULATION LAYERS IN A SEMICONDUCTOR DEVICE

CROSS-REFERENCE TO RELATED APPLICATIONS

The present application claims priority to Korean patent application number 10-2005-0134953 filed on Dec. 30, 2005, which is incorporated herein by reference in its entirety.

BACKGROUND OF THE INVENTION

The present invention relates to an electro-static discharge (ESD) protection circuit, and more particularly to an ESD protection circuit capable of protecting a gate insulating layer of a NMOS transistor constituting an internal circuit of a semiconductor.

In general, an ESD protection circuit represents a circuit formed between an internal circuit of a semiconductor and a pad connected to an external input/output pin in order to prevent the destruction or deterioration of products due to an ESD when designing the semiconductor device.

If an electrically charged human body or machine makes contact with a semiconductor circuit, the ESD accumulated in the human body or the machine is discharged inside the semiconductor circuit through an external pin of the semiconductor circuit via an input/output pad. Accordingly, excessive current having high energy due to the discharge may inflict fatal damage on an internal circuit of the semiconductor.

Most semiconductor circuits include an ESD protection circuit between the input/output pad and the internal circuit of the semiconductor so as to prevent the semiconductor circuit from being damaged by an ESD.

In the meantime, with the development of semiconductor technology, the gate insulating layer of an NMOS transistor constituting an internal circuit of the semiconductor becomes thinner. If the gate insulating layer becomes thinner, a lower destructive voltage can cause harm to the gate insulating layer. Therefore, the internal circuits of a semiconductor device should be protected from being easily damaged by an ESD.

FIG. 1 is a circuit diagram illustrating the conventional ESD protection circuit, which shows an electrostatic discharge circuit 100, an input buffer 120, and an internal circuit 140.

Since the gate of an NMOS transistor N1 included in the input buffer 120 is directly connected to the input/output pad 102, it is very susceptible to an excessive ESD voltage applied through the input/output pad 102.

To solve this problem, an NMOS transistor N2 for electrostatic protection is installed between the input/output pad 102 and the input buffer 120. When the gate voltage of the NMOS transistor N1 in the input buffer 120 excessively increases due to an ESD, the NMOS transistor N2 is turned on for electrostatic protection, thereby preventing damage occurring to the gate insulating layer of the NMOS transistor N1 in the input buffer 120.

However, since the gate of a conventional NMOS transistor N2 used for electrostatic protection is connected to the ground voltage supply pad (VSS), the ESD onset voltage capable of discharging the ESD becomes very high. That is, when the voltage between the drain and the source of the NMOS transistor N2 for electrostatic protection, at which the NMOS transistor N2 starts ESD discharge operation, is higher than the destructive voltage for the gate insulating layer of the NMOS transistor N1 in the input buffer 120, the gate insulating layer of the NMOS transistor N1 in the input buffer 120 is broken before the NMOS transistor N2 for the electrostatic protection operates.

SUMMARY OF THE INVENTION

Accordingly, the present invention solves the above-mentioned and other problems occurring in the prior art. The present invention performs, inter alia, a protection circuit operation before the gate insulating layer of an NMOS transistor in an internal circuit of a semiconductor operates or is damaged due to an electrostatic discharge (ESD).

The present invention provides ways to drive a protection circuit by an excessive voltage before the excessive voltage due to ESD is transmitted to the gate of an NMOS transistor in an internal circuit of a semiconductor.

In accordance with one aspect of the present invention, there is provided an ESD protection circuit for protecting an internal circuit of a semiconductor, the ESD protection circuit being installed between an input/output pad and an input buffer including a first NMOS transistor, the ESD protection circuit including: a first electrostatic protection unit connected to the power source supply pad, wherein the first electrostatic protection unit discharges an ESD current into the power source supply pad when an ESD is introduced into the input/output pad, and generates a first driving voltage by means of a voltage-drop unit thereby causing an ESD current to flow; a driver driven by the first driving voltage, wherein the driver generates a second driving voltage by an ESD current; and a second electrostatic protection unit for discharging the introduced ESD current into the power source supply pad by the second driving voltage, thereby reducing a voltage applied to the gate of the first NMOS transistor.

It is preferred that the input buffer is an inverter for inverting the phase of signals inputted in the input/output pad and transmitting the signals to an internal circuit of a semiconductor.

Further, the input buffer includes a PMOS transistor and a first NMOS transistor, wherein the PMOS transistor has a source to which a power source voltage is applied, a substrate connected to the source, a gate connected to the input/output pad, and a drain connected to the internal circuit of the semiconductor, wherein the first NMOS transistor has a source to which a ground voltage is applied, a substrate connected to the source, a gate connected to the input/output pad, and a drain connected to the internal circuit of the semiconductor.

It is preferred that the power source supply pad includes a power source voltage supply pad and a ground voltage supply pad.

It is preferred that the second electrostatic protection unit includes a second NMOS transistor having a drain connected to the gate of the first NMOS transistor and the input/output pad, a source connected to the ground voltage supply pad, a substrate connected to the source, and a gate connected to the driver.

Further, the driver includes: a PMOS transistor having a source and a substrate connected to the input/output pad, a gate connected to the power source voltage supply pad, and a drain connected to the gate of the second NMOS transistor; and a resistor with the first end connected to the drain of the PMOS transistor and the other end connected to the ground voltage supply pad.

Further, the first electrostatic protection unit includes the voltage-drop means between the input/output pad and the source of the PMOS transistor.

Further, the voltage-drop means includes at least one diode or a diode and at least one resistor.

Further, the voltage-drop means also includes: a first diode installed between the input/output pad and the source of the PMOS transistor; a second diode connected in parallel to the first diode; and at least one resistor connected in series to the second diode.

Furthermore, the first electrostatic protection unit includes: a capacitor having a first end of the capacitor connected to the power source voltage supply pad; a resistor with the first end connected to the other end of the capacitor, and the other end connected to the ground voltage supply pad; and a third NMOS transistor having a drain connected to the power source voltage supply pad, a gate connected to the first end of the resistor, a source connected to the ground voltage supply pad, and a substrate connected to the source.

In accordance with another aspect of the present invention, there is provided an ESD protection circuit for protecting an internal circuit of the semiconductor, the ESD protection circuit being installed between the input/output pad and the input buffer including the first NMOS transistor, the ESD protection circuit including: a first electrostatic protection unit connected to the power source supply pad, wherein the first electrostatic protection unit discharges an ESD current into the power source supply pad when an ESD is introduced into the input/output pad, generates a first driving voltage, and generates a second driving voltage by means of a voltage-drop capable of causing an ESD current to flow; a driver driven by the second driving voltage, wherein the driver generates a third driving voltage by using an ESD current; and a second electrostatic protection unit for discharging the introduced ESD current into the power source supply pad by the first driving voltage and the third driving voltage, thereby reducing the voltage applied to the gate of the first NMOS transistor.

It is preferred that the first electrostatic protection unit includes: a third NMOS transistor having a drain connected to the power source supply pad, a gate connected to both the drain of the PMOS transistor and the gate of the second NMOS transistor, a source connected to the ground supply pad, and a substrate connected to the source; a capacitor having the first end connected to the power source voltage supply pad, and the other end connected to the gate of the third NMOS transistor; and a resistor having the first end connected to the other end of the capacitor, and the other end connected to the ground voltage supply pad, wherein the first electrostatic protection unit applies the first driving voltage applied to both ends of the resistor to the gate of the second NMOS transistor when an ESD current is discharged into the ground voltage supply pad.

BRIEF DESCRIPTION OF THE DRAWINGS

The above-described and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to the accompanying drawings.

The present invention includes an input buffer between an input/output pad and an internal circuit, and an electrostatic protection unit additionally formed on the input side of the input buffer that operates upon the detection of an ESD.

Figure 2:
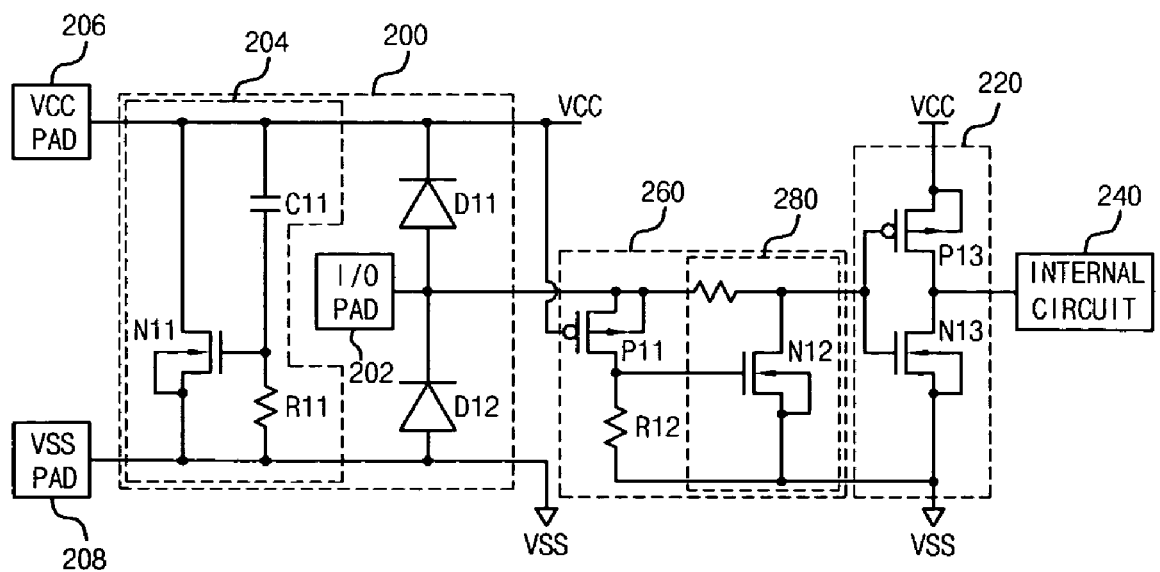
FIG. 2 is a circuit diagram for illustrating an electrostatic discharge protection circuit according to a first embodiment of the present invention.

Referring to FIG. 2, an ESD protection circuit according to a first embodiment of the present invention includes a first electrostatic protection unit 200, a driver 260, and a second electrostatic protection unit 280, which are installed between an input/output pad 202 and an input buffer 220. Herein, the input buffer 220 is an inverter for inverting the phase of signals inputted in the input/output pad 202 and transferring the signals to an internal circuit 240 of a semiconductor. The input buffer 220 includes a PMOS transistor P13 and an NMOS transistor N13, which are connected in series to each other.

The first electrostatic protection unit 200 includes a power source clamp circuit 204 and two diodes D11 and D12. When the ESD is introduced into the input/output pad 202, the first electrostatic protection unit 200 discharges the introduced ESD into the power source voltage supply pad 206 and the ground voltage supply pad 208.

The power source clamp circuit 204 may include an NMOS transistor N11, a capacitor C11, and a resistor R11. The NMOS transistor N11 has a drain, a source, a substrate, and a gate, wherein the drain is connected to the power source voltage supply pad 206, the source and the substrate are connected to the ground voltage supply pad 208, and the gate of the NMOS transistor N11 is connected to the node between the resistor R11 and the capacitor C11. The NMOS transistor N11 discharges the positive electrostatic potential, which is introduced into the input/output pad 202, to the ground voltage supply pad 208.

The capacitor C11 is connected between the power source voltage supply pad 206 and the resistor R11. The resistor R11 is connected to the capacitor C11 and the ground voltage supply pad 208. The node between the capacitor C11 and the resistor R11 is connected to the gate of the NMOS transistor N11.

The NMOS transistor N11 operates by a voltage applied to the node between the resistor R11 and the capacitor C11, thereby discharging the ESD introduced into the input/output pad 202 to the ground voltage supply pad 208.

A diode D11 is connected forward between the input/output pad 202 and the power source voltage supply pad 206, thereby inducing an ESD current into the line of the power source voltage supply pad 206 when the positive electrostatic potential is introduced into the input/output pad 202. Moreover, a diode D12 is connected backward between the input/output pad 202 and the ground voltage supply pad 208, thereby introducing an ESD current into the input/output pad 202 when a negative electrostatic potential is introduced into the input/output pad 202.

When an ESD is introduced into the input/output pad 202, the driver 260 operates by the ESD voltage dropped by the diode D11, and detects the ESD introduced into the input/output pad 202 through the resistor R12. The voltage detected by the resistor R12 is used as the driving voltage of the second electrostatic protection unit 280.

The second electrostatic protection unit 280 includes an NMOS transistor N12 operating by the driving voltage of the driver 260.

The driver 260 includes a PMOS transistor P11 having a source, a substrate, a gate, and a drain, wherein the source and the substrate are commonly connected to the input/output pad 202, the gate is connected to the power source supply pad 206, and the drain is connected to the ground VSS through the resistor R12.

When an ESD is introduced into the input/output pad 202, the second electrostatic protection unit 280 receives a driving voltage from the driver 260, and then discharges the ESD applied to the gate of the NMOS transistor N13 of the input buffer 220 into the ground.

The second electrostatic protection unit 280 includes the NMOS transistor N12 having a drain, a source, a substrate, and a gate, wherein the drain is connected to the input/output pad 202, the source and the substrate are connected to the ground VSS, and the driving voltage of the driver 260 is applied to the gate.

The ESD protection circuit as constructed in FIG. 2 protects an internal circuit 240 from being damaged by an ESD through the operations of the first electrostatic protection unit 200 and the second electrostatic protection unit 280.

First, the operation of the first electrostatic protection unit 200 will be described.

When the positive electrostatic potential is introduced into the input/output pad 202 and thus a forward cut-in voltage of the diode D11 (0.7V) is exceeded, the diode D11 induces the ESD current into the line connected to the power source voltage supply pad 206.

The ESD current introduced into the line of the power source voltage supply pad 206 turns on the MOS transistor N11 of the power source clamp circuit 204, and is then discharged into the ground voltage supply pad 208 through the NMOS transistor N11.

Next, the operation of the second electrostatic protection unit 280 will be described.

The second electrostatic protection unit 280 operates by the driving voltage of the driver 260. A voltage applied to the gate of the PMOS transistor P11 connected to the line of the power source voltage supply pad 260 is as low as the cut-in voltage of a diode as compared to the ESD voltage applied to the input/output pad. Since the source and the substrate of the PMOS transistor P11 are connected to the input/output pad 202, the voltage applied to the gate of the PMOS transistor P11 is lower than the voltage applied to the source and the substrate of the PMOS transistor P11. As a result, the PMOS transistor P11 would turn on.

Accordingly, the ESD current flows into the resistor R12 through the turned-on PMOS transistor P11 and the driving voltage is applied to the resistor R12. That is, the driving voltage formed by R12 is applied to the gate of the NMOS transistor N12 in the second electrostatic protection unit 280.

As a result, the NMOS transistor N12 is turned on by the driving voltage supplied at the driver 260, and the introduced ESD is discharged by the NMOS transistor N12 without affecting the NMOS transistor N13 of the input buffer 220.

In the prior art, the ESD protection circuitry was operated with the NMOS transistor of an input buffer (such as N1 in FIG. 1 or, for example just for comparison, a NMOS transistor in an input buffer 220 of the present invention) in a turned-on state. However, in an embodiment of the present invention, the second electrostatic protection unit 280 operates by the driving voltage generated by the driver 260 having detected ESD.

Accordingly, before the gate voltage of the NMOS transistor N13 of the input buffer 220 becomes excessively high by the ESD, the NMOS transistor N12 for electrostatic protection is turned on, such that it is possible to prevent the gate insulating layer of the NMOS transistor N13 in the input buffer 220 from being damaged.

Figure 1:
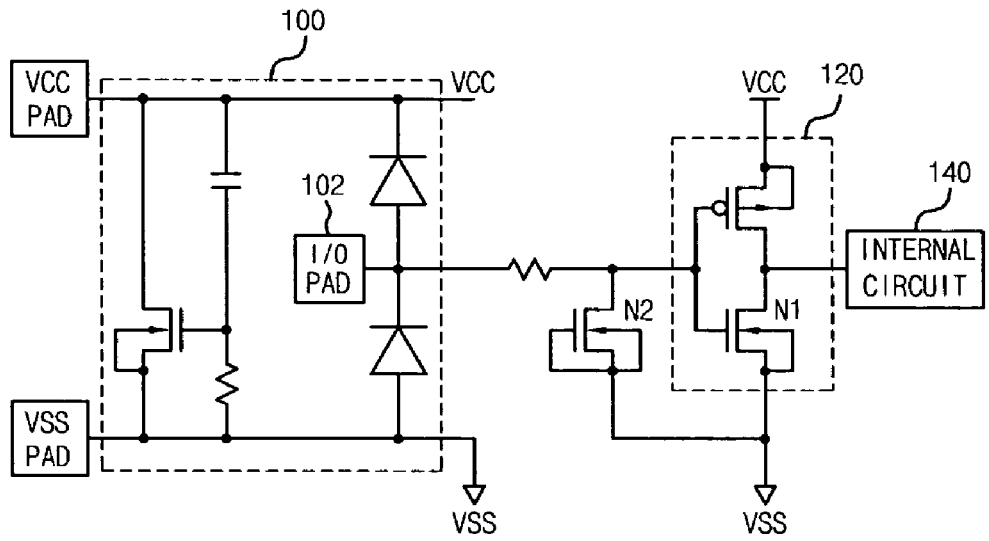
FIG. 1 is a circuit diagram for illustrating the conventional electrostatic discharge protection circuit.
Figure 3:
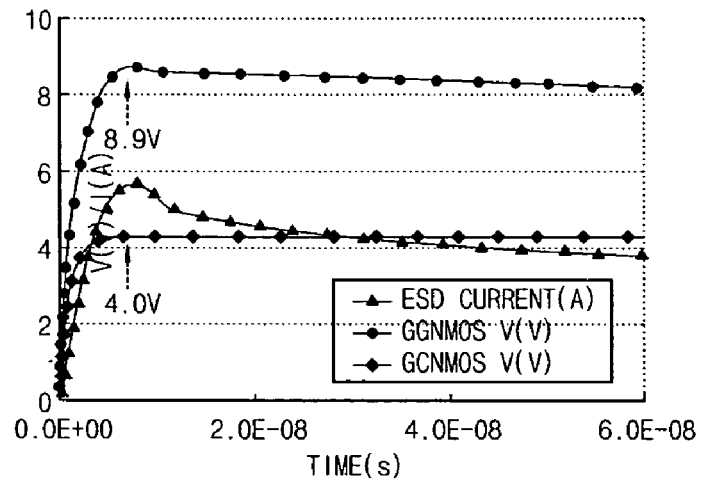
FIG. 3 is a graph illustrating simulation results regarding the drain voltage for the GGNMOS N2 of an electrostatic discharge protection circuit in FIG. 1 versus a drain voltage for the GCNMOS N12 of the electrostatic discharge protection circuit in FIG. 2.

FIG. 3 is a graph illustrating results obtained by simulating a voltage applied to the drain of a Gate Grounded NMOS (GGNMOS) of the ESD protection circuit in FIG. 1, a voltage applied to the drain of a Gate-Coupled NMOS (GCNMOS) of the ESD protection circuit in FIG. 2, and an ESD current discharged into the ground.

Herein, the GGNMOS transistor represents an NMOS transistor, the gate of which is grounded to the ground, that is, the NMOS transistor N2 of the conventional ESD protection circuit in FIG. 1. The GCNMOS transistor represents an NMOS transistor, the gate of which is connected to the resistor of the driver, that is, the NMOS transistor N12 of the ESD protection circuit in FIG. 2.

The simulation was performed under the following conditions: a Human Body Model (HBM) ESD voltage of positive potential 8000V was applied to the input/output pad; an identical power source clamp circuit was used; the PMOS transistor P11 in the ESD protection circuit of FIG. 2 had a width of 20 um; and the resistor R12 had a resistance of 5 KΩ.

As shown in FIG. 3, the NMOS transistor N2 of the conventional electrostatic discharge protection circuit has an ESD onset voltage of about 8.9V. However, the NMOS transistor N12 of the electrostatic discharge protection circuit according to the embodiment of the present invention has the ESD onset voltage of about 4 V. That is, it can be understood that the ESD onset voltage of the NMOS transistor N12 according to the embodiment of the present invention is reduced by more than 50% as compared to that of the prior art.

Consequently, in the ESD protection circuit according to the present invention, since a bias voltage of more than 4 V is not applied to the gate of the NMOS transistor in the input buffer, it is possible to more effectively protect the gate insulating layer of the NMOS transistor N13 in the input buffer as compared to the prior art.

Since the voltage required for maintaining the gate insulating layer of the NMOS transistor without any destruction is generally proportional to the thickness of the gate insulating layer, the ESD protection circuit of the present invention causes the gate insulating layer of the NMOS transistor used in the internal circuit to have a thickness reduced to less than half.

Meanwhile, the present invention considerably increases the difference between the voltages applied to the source and the gate of the PMOS transistor P11 constituting the driver, thereby improving the operation speed of the PMOS transistor P11.

Figure 4:
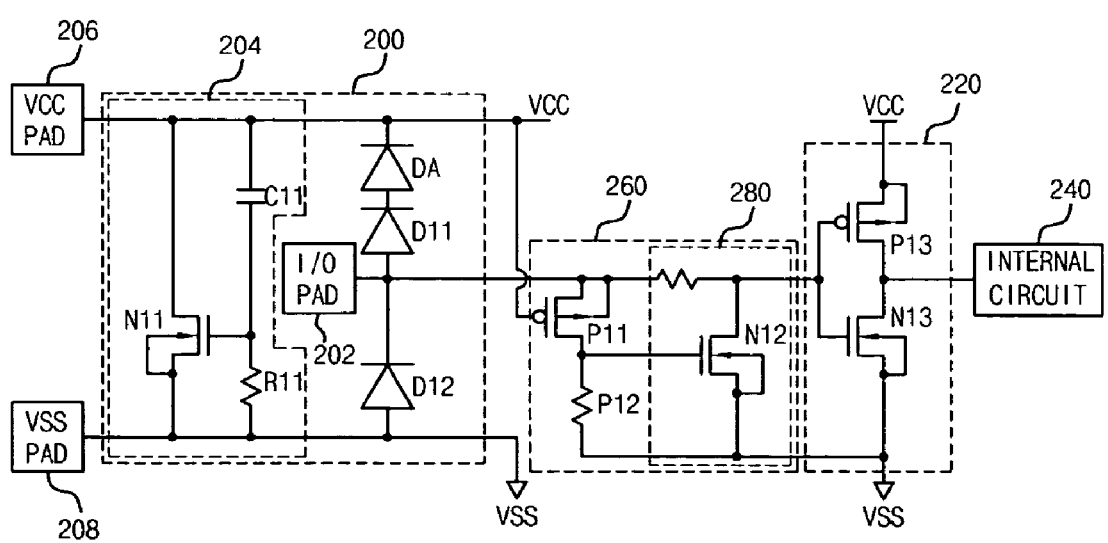
FIG. 4 is a circuit diagram for depicting a voltage-drop means of the ESD protection circuit of FIG. 2.

FIG. 4 depicts the ESD protection circuit of FIG. 2 in which at least one or more diodes DA in series are added to the forward diode D11 installed between the input/output pad 202 and the gate of the PMOS transistor P11.

As shown in FIG. 4, when the diode DA is additionally installed, a voltage applied to the gate of the PMOS transistor P11 becomes lower than the ESD voltage applied to the input/output pad 202 by the number of the added diodes DA.

Accordingly, since the difference between the source voltage and the gate voltage of the PMOS transistor P11 increases, the PMOS transistor P11 can operate more rapidly as compared to an ESD protection circuit in which one diode is installed.

The present invention is not limited to this embodiment of the present invention in which one diode DA is added That is, two or more diodes can be added within the range in which the turn-on operation time point of PMOS transistor P11 can be optimized.

Figure 5:
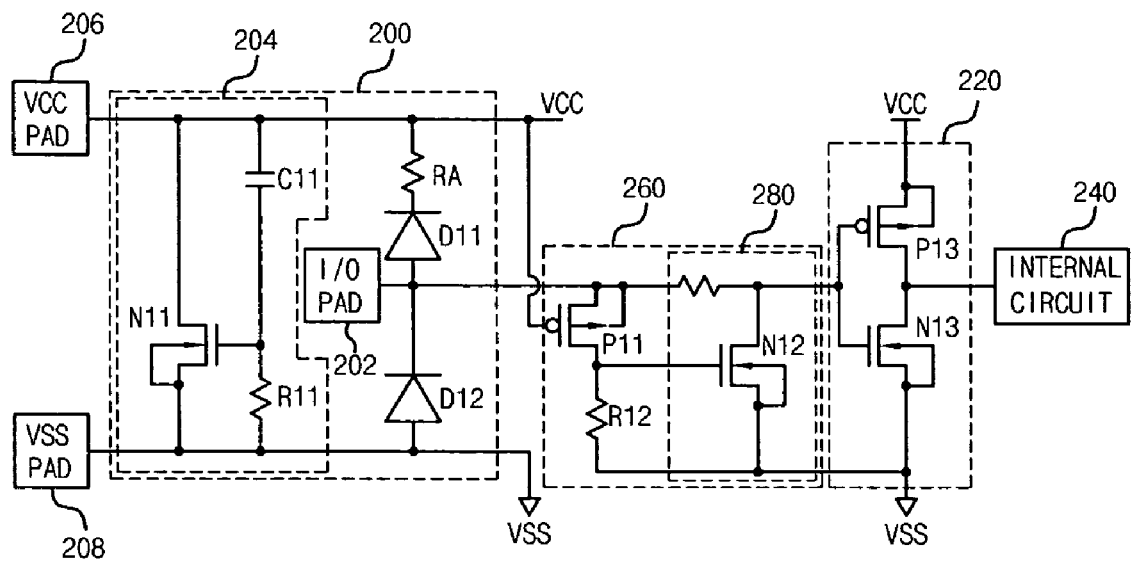
FIG. 5 is a circuit diagram for depicting another voltage-drop means of the electrostatic discharge protection circuit of FIG. 2.

FIG. 5 depicts the ESD protection circuit of FIG. 2 in which at least one or more resistors RA in series is added to the forward diode D11 installed between the input/output pad 202 and the gate of the PMOS transistor P11.

When the resistor RA is additionally installed, the voltage applied to the gate of the PMOS transistor P11 becomes lower than the ESD voltage applied to the input/output pad 202 by the number of the added resistors RA.

Accordingly, in the ESD protection circuit of FIG.5, since the difference between the source voltage and the gate voltage of the PMOS transistor P11 increases as compared to the case of FIG. 2, the PMOS transistor P11 can rapidly operate.

The present invention is not limited to the embodiment as illustrated in FIG. 5 in which one resistor RA is added. That is, two or more resistors can be added within the range in which the turn-on operation time point of the PMOS transistor P11 can be optimized.

Figure 6:
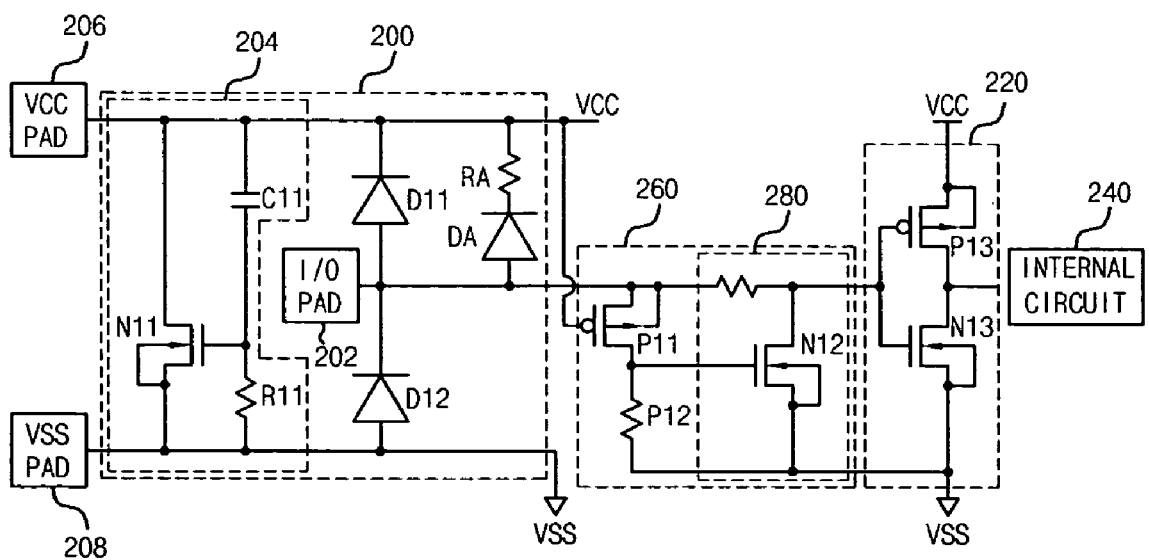
FIG. 6 is a circuit diagram for further depicting another voltage-drop means of the ESD protection circuit of FIG. 2.

FIG. 6 depicts the ESD protection circuit of FIG. 2 in which one or more voltage-drop elements in parallel are added to the diode D11 installed between the input/output pad 202 and the gate of the PMOS transistor P11. Herein, the voltage-drop element corresponds to the diode DA and the resistor RA, which are connected in series to each other.

As shown in FIG. 6, if a positive electrostatic potential is introduced into the input/output pad 202, the ESD current flows through the diode DA and the resistor RA as well as the diode D11.

Accordingly, the voltage applied to the gate of the PMOS transistor P11 becomes lower than the ESD voltage applied to the input/output pad 202 by the cut-in voltage of the diode DA and the voltage applied to the resistor RA.

That is, since the difference between the voltages applied to the source and the gate of the PMOS transistor P11 increases, the PMOS transistor P11 can rapidly operate as compared to the case in which one diode D11 has been installed.

Figure 7:
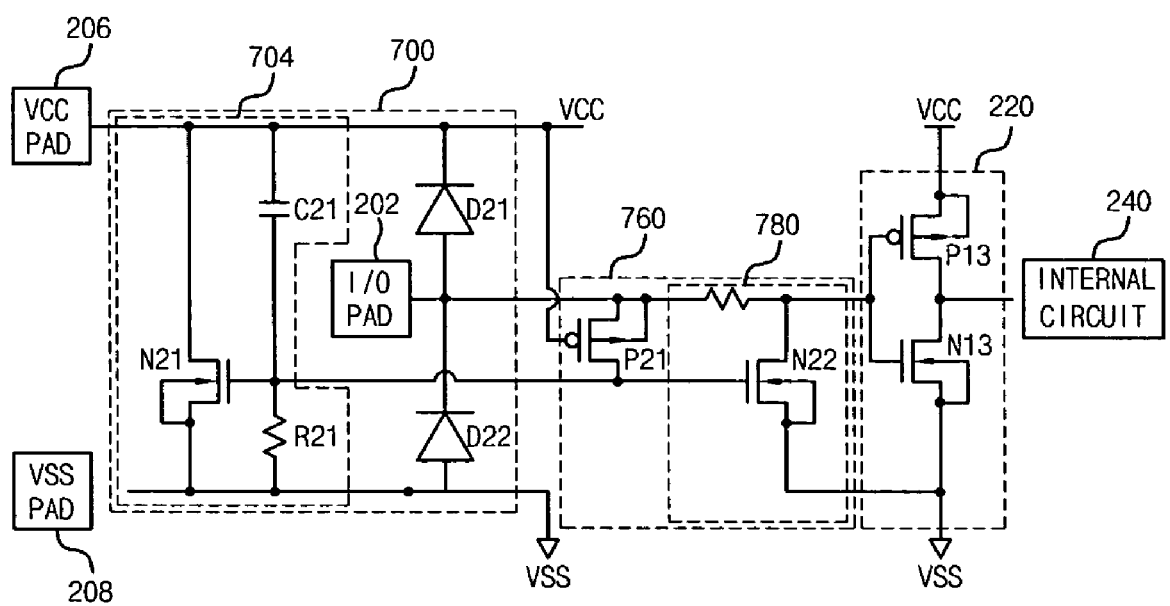
FIG. 7 is a circuit diagram for illustrating an ESD protection circuit according to the second embodiment of the present invention.

FIG. 7 is a circuit diagram for illustrating the ESD protection circuit according to the second embodiment of the present invention. The ESD protection circuit of FIG. 7 includes a first electrostatic protection unit 700, a driver 760, and a second electrostatic protection unit 780 which are installed between the input/output 202 and the input buffer 220. The first electrostatic protection unit 700 includes a power source clamp circuit 704 and two diodes D21 and D22, and discharges the ESD into the power source voltage supply pad 206 and the ground voltage supply pad 208 when an ESD is introduced into the input/output pad 202. The power source clamp circuit 704 may include an NMOS transistor N21, a capacitor C21 and a resistor R21.

The driver 760 includes a PMOS transistor P21, and the second electrostatic protection unit 780 includes an NMOS transistor N22.

In the construction between the driver 260 and the second electrostatic protection unit 280, the gate of the NMOS transistor N22 is connected to the drain of the PMOS transistor P21 and the connection node of the capacitor 21 and the resistor R21 in the power source clamp circuit 704. Herein, the NMOS transistor N22 corresponds to the NMOS transistor N12 of the first embodiment.

In the ESD protection circuit of FIG. 7, a process similar to the operation process described in the first embodiment is performed. That is, since the PMOS transistor P21 is turned on to increase the gate voltage of the NMOS transistor N21, and the drain of the PMOS transistor P21 and the gate of the NMOS transistor N22 are connected to the resistor R21 of the clamp circuit, the voltage generated at both ends of the resistor R21 when the first electrostatic protection unit 700 discharges an ESD current can be additionally applied to the gate of the NMOS transistor N22.

As a result, in the second embodiment, the resistor R12 connected to the drain of the PMOS transistor P11 can be removed in the first embodiment. Moreover, the ESD onset voltage of the NMOS transistor N22 becomes further lower as compared to the first embodiment, such that it is possible to effectively protect the gate insulating layer of the NMOS transistor N13 of the input buffer 220. Since other components and operations thereof are the same as those described in the first embodiment, the details will be omitted.

Meanwhile, the second embodiment of the present invention creates a considerable difference between the source voltage and the gate voltage of the PMOS transistor P11 constituting the driver, thereby improving the operation speed of the PMOS transistor P11. Since the construction and the operation thereof are the same as those described in FIGS. 4 through 6, the details will be omitted.

As described above, the ESD protection circuit of the present invention applies a voltage higher than the threshold voltage of an NMOS transistor included in an internal circuit of a semiconductor to the gate of an NMOS transistor performing an electrostatic discharge operation so as to protect the gate insulation layer of the NMOS transistor included in the internal circuit of the semiconductor. Accordingly, the gate insulation layer of the NMOS transistor included in the internal circuit of the semiconductor can have a thickness much thinner than that of the prior art, such that it is possible to easily develop high-speed and highly integrated semiconductor elements and to ensure the mass-production thereof.

Although preferred embodiments of the present invention has been described for illustrative purposes, those skilled in the art will appreciate that various modifications, additions and substitutions are possible, without departing from the scope and spirit of the invention as disclosed in the accompanying claims.

What is claimed is:

1. An electrostatic discharge (ESD) protection circuit for protecting an internal circuit of a semiconductor, the ESD protection circuit being installed between an input/output pad and an input buffer including a first NMOS transistor, the ESD protection circuit comprising:

a first electrostatic protection unit connected to a power source supply pad, wherein the first electrostatic protection unit discharges an ESD current into the power source supply pad when an ESD is introduced into the input/output pad, and generates a first driving voltage by utilizing the ESD current flow through a voltage-drop unit;

a driver driven by the first driving voltage, wherein the driver generates a second driving voltage by an ESD current; and a second electrostatic protection unit driven by the second driving voltage for discharging the introduced ESD current into the power source supply such that a voltage applied to a gate of the first NMOS transistor is reduced;

wherein the power source supply pad includes a power source voltage supply pad and a ground voltage supply pad, wherein the second electrostatic protection unit includes a second NMOS transistor having a drain connected to the gate of the first NMOS transistor and the input/output pad, a source connected to the ground voltage supply pad, a substrate connected to the source, and a gate connected to the driver, and wherein the driver comprises:
  a PMOS transistor having a source and a substrate connected to the input/output pad, a gate connected to the power source voltage supply pad, and a drain connected to the gate of the second NMOS transistor; and
  a resistor having a first end connected to the drain of the PMOS transistor and a second end connected to the ground voltage supply pad.

2. The ESD protection circuit as claimed in claim 1, wherein the first electrostatic protection unit includes the voltage-drop unit between the input/output pad and the source of the PMOS transistor.

3. The ESD protection circuit as claimed in claim 2, wherein the voltage-drop unit includes at least one diode.

4. The ESD protection circuit as claimed in claim 2, wherein the voltage-drop unit includes a diode and at least one resistor.

5. The ESD protection circuit as claimed in claim 2, wherein the voltage-drop drop unit comprises:
  a first diode installed between the input/output pad and the source of the PMOS transistor;
  a second diode connected in parallel to the first diode; and
  at least one resistor connected in series to the second diode.

6. The ESD protection circuit as claimed in one of claims 1 to 5, wherein the first electrostatic protection unit comprises:
  a capacitor having a first end of the capacitor connected to the power source voltage supply pad;
  a resistor having a first end connected to a second end of the capacitor, and a second end connected to the ground voltage supply pad; and
  a third NMOS transistor having a drain connected to the power source voltage supply pad, a gate connected to the first end of the resistor, a source connected to the ground voltage supply pad, and a substrate connected to the source.

7. An electrostatic discharge (ESD) protection circuit for protecting an internal circuit of a semiconductor, the ESD protection circuit being installed between an input/output pad and an input buffer including a first NMOS transistor, the ESD protection circuit comprising:
  a first electrostatic protection unit connected to a power source supply pad, wherein the first electrostatic protection unit discharges an ESD current into the power source supply pad when an ESD is introduced into the input/output pad, and generates a first driving voltage, and generates a second driving voltage by utilizing the ESD current flow through a voltage-drop unit;
  a driver driven by the second driving voltage, wherein the driver generates a third driving voltage by using an ESD current; and
  a second electrostatic protection unit driven by the first driving voltage and the third driving voltage for discharging the introduced ESD current into the power source supply pad such that a voltage applied to a gate of the first NMOS transistor is reduced;

wherein the power source supply pad includes a power source voltage supply pad and a around voltage supply pad, wherein the second electrostatic protection unit includes a second NMOS transistor having a drain connected to the gate of the first NMOS transistor and the input/output pad, a source connected to the ground voltage supply pad, a substrate connected to the source, and a gate connected to the driver, and wherein the driver includes a PMOS transistor having a source and a substrate connected to the input/output pad, a gate connected to the power source voltage supply pad, and a drain connected to the gate of the second NMOS transistor.

8. The ESD protection circuit as claimed in claim 7, wherein the first electrostatic protection unit comprises:
  a third NMOS transistor having a drain connected to the power source supply pad, a gate connected to both the drain of the PMOS transistor and the gate of the second NMOS transistor, a source connected to the ground supply pad, and a substrate of connected to the source;
  a capacitor having a first end connected to the power source voltage supply pad, and a second end connected to the gate of the third NMOS transistor; and
  a resistor having a first end connected to the second end of the capacitor, a second end connected the ground voltage supply pad, wherein the first electrostatic protection unit applies the first driving voltage applied to both ends of the resistor to the gate of the second NMOS transistor when an ESD current is discharged into the ground voltage supply pad.

9. The ESD protection circuit as claimed in claim 8, wherein the first electrostatic protection unit includes the voltage-drop unit between the input/output pad and the source of the PMOS transistor.

10. The ESD protection circuit as claimed in claim 9, wherein the voltage-drop unit includes at least one diode.

11. The ESD protection circuit as claimed in claim 10, wherein the voltage-drop unit includes a diode and at least one resistor.

12. The ESD protection circuit as claimed in claim 10, wherein the voltage-drop unit comprises:
  a first diode installed between the input/output pad and the source of the PMOS transistor;
  a second diode connected in parallel to the first diode; and
  at least one resistor connected in series to the second diode.

* * * * *

UNITED STATES PATENT AND TRADEMARK OFFICE
CERTIFICATE OF CORRECTION

PATENT NO. : 7,430,099 B2  Page 1 of 1
APPLICATION NO. : 11/648328
DATED : September 30, 2008
INVENTOR(S) : Kook Whee Kwak et al.

It is certified that error appears in the above-identified patent and that said Letters Patent is hereby corrected as shown below:

Title page, Item (75)    delete "Seongnam-si (KR)" and insert --Kyoungki-do (KR)--.

Signed and Sealed this

Sixteenth Day of June, 2009

JOHN DOLL
*Acting Director of the United States Patent and Trademark Office*